United States Patent [19]

Rowson et al.

[11] Patent Number: 4,745,084

[45] Date of Patent: May 17, 1988

[54] METHOD OF MAKING A CUSTOMIZED SEMICONDUCTOR INTEGRATED DEVICE

[75] Inventors: James A. Rowson, Fremont; Stephen M. Trimberger, San Jose, both of Calif.

[73] Assignee: VLSI Technology, Inc., San Jose, Calif.

[21] Appl. No.: 930,305

[22] Filed: Nov. 12, 1986

[51] Int. Cl.$^4$ .................................... H01L 21/70
[52] U.S. Cl. ........................... 437/51; 437/59; 357/45; 364/491; 307/445
[58] Field of Search .................. 29/577 C; 364/491; 307/445; 357/45; 437/51, 59

[56] References Cited

U.S. PATENT DOCUMENTS

| | | | |
|---|---|---|---|
| 4,580,228 | 4/1986 | Noto | 264/491 |
| 4,591,993 | 5/1986 | Griffin et al. | 364/491 |
| 4,613,940 | 9/1986 | Shenton et al. | 364/491 |
| 4,627,152 | 12/1986 | De Hond et al. | 29/571 |

OTHER PUBLICATIONS

Sechen et al., "The Timberwolf Placement and Routing Package", IEEE J. of Solid-State Circuits, Apr. 1985, pp. 510–522.

"Automated Design of CMOS Leaf Cells", by John T. Nogatch, et al.; VLSI Systems Design, Nov. 1985.

"Advanced CMOS Gate Array Architecture Combining 'Gate Isolation' and Programmable Routing Channels", by Wilhelmus Van Noije, et al., IEEE Journal of Solid State Circuits, vol. SC-20, No. 2, Apr. 1985.

Primary Examiner—Brian E. Hearn
Assistant Examiner—T. N. Quach
Attorney, Agent, or Firm—Limbach, Limbach & Sutton

[57] ABSTRACT

A method of fabricating a plurality of electronic circuits with transistors in schematic form in a customizable semiconductor integrated device, such as a base array, is disclosed. The base array has a plurality of chains of continuously electrically connected transistors, all of the same type, with the drain of a transistor connected to the source of an adjacent transistor. The schematic transistors are grouped by diffusion line tracing to form a plurality of groups. Each group of schematic transistors is assigned to physical transistors in the base array. The cost function associated with each group of physical transistors is calculated. The total cost function is optimized by changing the assignment of one or more groups of the schematic transistors to the physical transistors. The electrical interconnection from one group of physical transistors to another group of physical transistors is routed to form the physical layout of the circuit. Isolation transistors are also provided to isolate physical layouts of the circuit from one another or to provide isolation between groups of physical transistors where isolation is needed. The gate of each isolation transistors is connected to a voltage source thereby isolating the physical layouts of the circuits.

8 Claims, 5 Drawing Sheets

+: ONLY VIAHOLE SITES

⊕: BOTH CONTACT HOLE/ VIA SITES

```
N andor .sgp
S 1 1
C A 1 1
C B 2 2
C C 3 3
C D 4 4
C OUT 5 5
X BULK 8
G  !vss
D  !vss
G               .  .  12 12 *2 g  .  !g
                .  *5  5  5 11 g  g  g  .  .  .  .  .  .  .  .  .  .  .  .  .  .  .  .  !vdd
G               .  .  5 11 11 *1 !g
D               .  15 . 13 13  g  g  g
                          *3
G               .  .  14 14  g  .  !g  .  .  .  .  .  .  .  .  .  .  .  .  .  .  .  .  !vdd
                             *4
D  !vss
G  !vss
E
```

FIG. 11.

```
|—— N TRANSISTORS ——|        |—— P TRANSISTORS ——|
                                                      PG   IP
IN   NG        NG NG PG PG        PG  PG  PG  PG  PG  PG
VSS ND ND ND ND ND ND    PD PD PD PD PD PD PD PD VDD ——TRACKS
 X   7 10 13  X 16 17   1  2   17 14 15 16  X 14 12 11  9  8  5   X ——COST PENALTY
```

FIG. 12.

METHOD OF MAKING A CUSTOMIZED SEMICONDUCTOR INTEGRATED DEVICE

TECHNICAL FIELD

The present invention relates to an improved method of fabricating a customized semiconductor integrated device and, more particularly, to a method of fabricating a semiconductor integrated device from a customizable semiconductor integrated device of the type generally known as gate arrays.

BACKGROUND OF THE INVENTION

Gate arrays are well-known in the art. These are semiconductor integrated devices which are customizable by the user to form a plurality of customized electrical circuits. Each electrical circuit is a logic unit or a macro, such as a logic gate, (AND, NAND, OR, NOR, etc.) or a more complex logic unit such as latch, flip-flop, adder, etc. The gate arrays are customized both to form the logic units and to interconnect the logic units. Hereinafter, the customized connection to form a logic unit will be referred to as the intra logic unit connection. The customized connection between the logic units will be referred to as the inter logic unit connection.

Typically, a gate array is comprised of a base array which has a plurality of transistors of the P conductivity type and of the N conductivity type arranged in an orderly array. The base array is then customized to provide the intra logic unit and inter logic unit connections. The customized circuits are formed by providing the electrical connection (typically, the metal mask layer(s)) to interconnect the transistors. Thus, a gate array is comprised of a base array which is common for all users and one or more metal interconnection layers which customizes the semiconductor device for the particular user's electrical circuit requirements.

In the prior art, gate arrays are formed by forming a base array of P type and N type transistors in a substrate. In an article entitled "Advanced CMOS Gate Array Architecture Combining 'Gate Isolation' And Programmable Routing Channels" by Wilhelmus Van Noije and Gilbert Declerck, published in the *IEEE Journal Of Solid State Circuits*, Vol. SC-20, No. 2, Apr. 1985, the authors described a gate array comprising a plurality of drain-source diffusion regions that are positioned in a substrate arranged in an array. The drain-source diffusion regions are spaced apart from one another. A plurality of gate regions are positioned on the substrate and are spaced apart from one another with each gate region lying substantially between a pair of adjacent drain-source diffusion regions. Thus, a chain of continuously electrically connected transistors is formed with the drain of each transistor electrically connected to the source of an adjacent transistor. The terms "drain" and "source" may be used interchangeably. Logic units are formed in such a chain of electrically connected transistors with an isolation transistor provided between each logical unit. The gate of the isolation transistor is connected to a voltage source, thereby isolating the logical units. If the isolation transistor is P conductivity type, the gate of the isolation transistor is connected to $V_{dd}$. If the isolation transistor is N conductivity type, the gate of the isolation transistor is connected to ground.

In the prior art, the interconnection of the transistors in a gate array to form the intra logic unit connection has been done by manual methods. Customizable gate arrays are typically referred to as semi-custom circuits, because the layout of the transistors in the gate array, i.e. the base array, has been pre-arranged.

A completely customized circuit is one in which none of the circuit element's layout has been prearranged. Thus, the circuit designer has total freedom in the layout of the circuit elements. One technique to layout a completely customized circuit is disclosed in a paper entitled "Automated Design Of CMOS Leaf Cells" by John T. Nogatch and Tom Hedges, published in the November 1985 issue of *VLSI Systems Design*, page 66. That technique is based upon the principle of the formation of a single diffusion line which connects a drain of a transistor to a source of a transistor through all the transistors.

The use of cost functions for transistor placement optimization is well known in the art. Cost functions are equations that are used to determine the efficiency of a particular layout of semiconductor circuits.

SUMMARY OF THE INVENTION

In the present invention, a method of fabricating an electronic circuit in an integrated semiconductor device in a substrate is disclosed. The electronic circuit is represented in netlist form and has a plurality of netlist transistors. The method comprises the steps of forming a plurality of chains of continuously electrically connected transistors, which are referred to as physical transistors. Each chain has physical transistors that are all of the same conductivity type in the substrate. Each of the physical transistors has a gate, a source and a drain. The physical transistors are electrically connected to an adjacent physical transistor to form the chain. For the electronic circuit, the netlist transistors are grouped by diffusion line tracing, thereby forming a plurality of groups. Each group of netlist transistors is assigned to a group of physical transistors. The cost function associated with each group of physical transistors is calculated. The total cost function for the groups of physical transistors is optimized by changing the assignment of one or more groups of netlist transistors to the groups of physical transistors, with the cost function recalculated thereafter. The electrical interconnection from one group of physical transistors to another group of physical transistors is routed to form the physical layout of the circuit.

BRIEF DESCRIPTION OF THE DRAWINGS

FIG. 11 shows in graphic form the output of the software used to perform the routing step.

FIG. 12 is a graph of the cost penalty associated with each track in a side view of the customizable device of the present invention used by the router program.

DETAILED DESCRIPTION OF THE DRAWINGS

Figure 1:
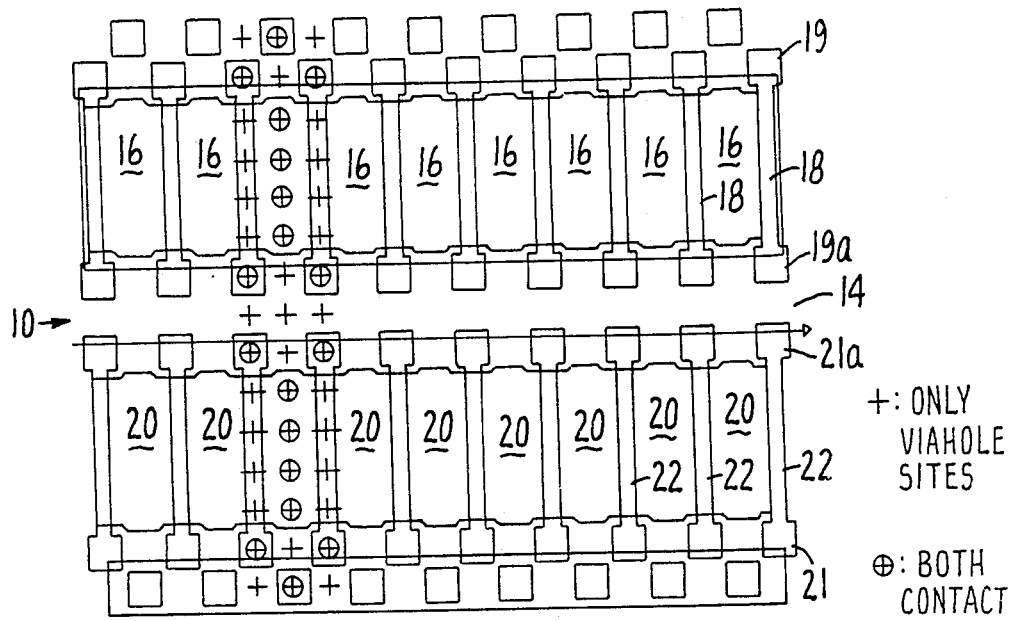
FIG. 1 is a top view of a customizable semiconductor integrated device of the prior art.

Referring to FIG. 1, there is shown a customizable semiconductor integrated device of the prior art, commonly known as a base array 10. The base array 10 comprises a substrate (not shown) of a semiconductive material. The substrate is of an N conductivity type. A plurality of drain source regions 16, substantially rectangularly shaped, are positioned spaced apart from one another in the substrate in an orderly array. A plurality of insulating regions (not shown), each also substantially rectangularly shaped, are positioned on the substrate spaced apart from one another with each insulating region lying substantially between a pair of adjacent drain-source regions 16. A plurality of gate regions 18, are positioned with each gate region 18 on an insulating region. Thus, the gate regions 18 and the drain-source regions 16 form a chain of continuously electrically connected transistors with the drain of each transistor electrically connected to the source of an adjacent transistor. The chain of plurality of transistors are of the P− conductivity type. A plurality of substantially rectangularly shaped members 19 and 19a are connected to each end of each gate regions 18 extending the gate regions 18 beyond the drain-source regions 16. The members 19 and 19a provide the electrical interconnection to the gate regions 18.

Immediately adjacent to and substantially parallel to the first chain of continuously electrically connected transistors is a P well 14. A second plurality of drain-source regions 20, with each drain-source region 20 substantially rectangularly shaped, are positioned in the P well 14 in an orderly array and spaced apart from one another. A second plurality of insulating regions (not shown), also substantially rectangularly shaped, are positioned on the substrate spaced apart from one another with each insulating region lying substantially between a pair of adjacent drain-source regions 20. A plurality of gate regions 22 are positioned, with each gate region 22 on an insulating region. Thus, a second chain of continuously electrically connected N type transistors with the drain of each transistor electrically connected to the source of an adjacent transistor is formed. Similar to the first chain of transistors, a plurality of members 21 and 21a are connected to each end of each gate region 22 to provide the electrical connection to the gate regions 22.

Figure 2:
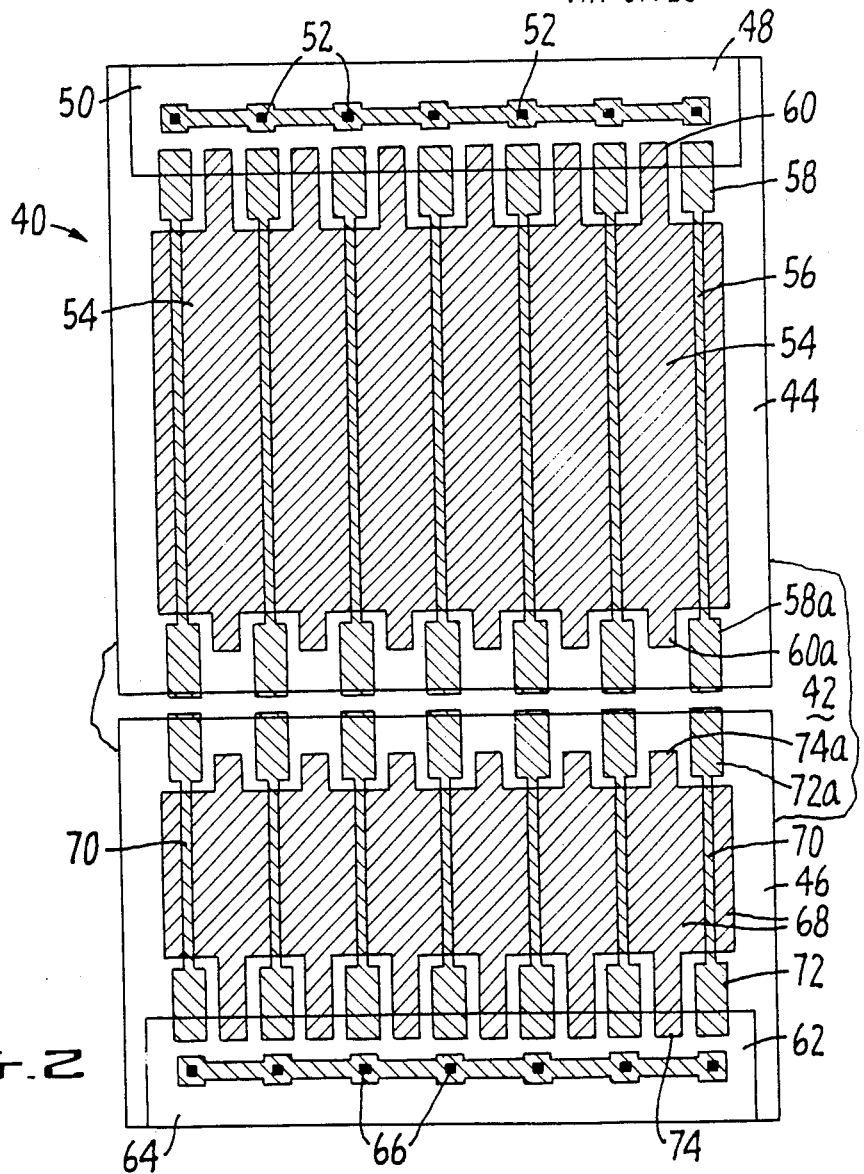
FIG. 2 is a top view of a customizable semiconductor integrated device of the present invention.

Referring to FIG. 2, there is shown a customizable semiconductor integrated device 40 of the present invention, which is an improvement to the customizable semiconductor integrated device 10 shown in FIG. 1. The device 40 comprises a substrate 42 of a semiconductive material. A N well 44 is formed in the substrate 42. The N well 44 is substantially rectangularly shaped. Spaced apart and substantially parallel to the N well 44 is a P well 46. The P well 46 is also substantially rectangularly shaped.

Within the N well 44 is an N+ diffusion region 48. A metallization layer 50 lies over the diffusion region 48 with a plurality of via holes 52 connecting the diffusion region 48 to the metal layer 50.

Within the N well 44 is also a plurality of drain-source regions 54. Each drain-source region 54 is substantially rectangularly shaped and is of a P+ diffusion region. Each of the drain-source regions 54 is positioned in the N well 44 in an orderly array and are spaced apart from one another. A plurality of insulating regions (not shown) is positioned spaced apart from one another with each of the insulating regions lying substantially between a pair of adjacent drain-source regions 54. Finally, a plurality of gate regions 56, each substantially rectangularly shaped, are position spaced apart from one another, lying substantially over each of the insulating regions which are between a pair of adjacent drain-source regions 54. The gate regions are typically made of heavily doped polysilicon to render them conductive. Thus, within the N well 44 is formed a chain of continuously electrically connected P type conductivity transistors with the drain of each P type transistor electrically connected to the source of an adjacent P type transistor.

The device 40 further comprises a plurality of first tabularly shaped members 58 and second tabularly shaped members 60. Each of the first tabularly shaped members 58 is electrically connected to one side of the rectangularly shaped gate regions 56. Thus, the first tabularly shaped members 58 are spaced apart from one another, arranged in an orderly array and are substantially parallel to one another, in the same manner as the gate regions 56 are spaced apart from one another, arranged in an orderly array and are parallel to one another.

A plurality of second tabularly shaped members 60 also spaced apart from one another are electrically connected to the drain-source regions 54 along one side of the rectangularly shaped drain-source regions 54. Each of the second tabularly shaped members 60 connected to a drain-source region 54 is positioned between adjacent members 58 and is spaced apart therefrom. Similarly, each of the tabularly shaped members 58 connected to a gate region 56 is positioned between adjacent tabularly shaped members 60 which are connected to the drain-source regions 54 and is spaced apart therefrom. Thus, the plurality of tabularly shaped members 58 and 60 form an interdigit like structure. The tabularly shaped members 58 provide for the interconnection to the gate region 56, to customize the device 40. The tabularly shaped members 60 provide electrical connections to the drain-source regions 54. As will be shown later, interconnection to the drain-source regions 54, is preferably made by connection to these tabularly shaped members 60.

Each of the tabularly shaped members 58 and 60 are substantially congruent in size and in shape. Further, each of the tabularly shaped members is substantially rectangularly shaped with the length, which is parallel to the length of the gate region 56 and/or drain-source regions 54, longer than the width. Finally, each of the tabularly shaped members 58 and 60 is of sufficient size to provide for at least two metal interconnect contacts in a direction parallel to its length. The first members 58 can be made of polysilicon and are extensions of the gate regions 58. The second members 60 can be made of diffusion material and are extensions of the drain-source regions 54.

At the other end of the rectangularly shaped drain-source regions 54 and gate regions 56, the side which is opposite and parallel to the one side, is a second plurality of tabularly shaped members 58a and 60a. Each of the tabularly shaped members 58a is connected to a gate region 56 and is substantially congruent to the tabularly shaped member 58. Each of the tabularly shaped member 60a, however, also being of substantially rectangularly shaped, has a length which is less than the length of the tabularly shaped members 60, which is connected at the other end of the drain-source regions 54. The reason for this will be discussed later.

As previously discussed, within the substrate 42 is a second well 46, which is of P type conductivity. A second chain of continuously electrically connected N-type transistors is in the P-type well 46. The fabrication of the N-type transistors is substantially identical to the discussion for the P-type transistors in the N well 44. A P+ diffusion region 62 is formed in the P well 46. A metal layer 64 lies over the P+ diffusion region 62 and has a plurality of via holes 66 to interconnect the metal layer 64 with the diffusion region 62.

A plurality of drain-source regions of the N+ conductivity type is formed in the well 46. Each of the drain-source regions 68 is substantially rectangularly shaped, positioned in the well 46, spaced apart from one another and arranged in an orderly array. A plurality of insulating regions arranged in an orderly array is positioned spaced apart from one another with each insulating region lying substantially between a pair of adjacent drain-source region 68. A plurality of gate regions 70 are positioned over the insulating regions and form the chain of continuously electrically connected N type transistors, with the drain of each transistor electrically connected to the source of an adjacent transistor.

Similar to the discussion for the structure shown in the well 44, within well 46 is also a plurality of tabularly shaped members 72 and 74. Each of the first tabularly shaped members 72 is electrically connected to each of the gate regions 70 on one side of the substantially rectangularly shaped gate region 70. Each of the second tabularly shaped members 74 is electrically connected to the on side of the substantially rectangularly shaped drain-source regions 68. The tabularly shaped members 72 and 74 are substantially parallel to one another and form an interdigit like structure with one member adjacent to an alternating member and spaced apart therefrom.

On the side opposite the one side of the rectangularly shaped regions 68 and 70, and immediately adjacent to, but spaced apart from the N well 44, are another plurality of tabularly shaped members 72a and 74a. The tabularly shaped members 72a are substantially congruent in size and shape to the tabularly shaped members 72 and to the tabularly shaped members 58 and 58a of the N well 44. The tabularly shaped members 74a, similar to the tabularly shaped members 60a in the N well 44, have a length which is shorter than the tabularly shaped members 72a. Each tabularly shaped member 72a is substantially opposite a tabularly shaped member 58a and each tabularly shaped member 74a is substantially opposite a tabularly shaped member 60a.

Since each drain-source region 68 is made of a diffusion region, the tabularly shaped members 74 and 74a can be extensions of those diffusion regions. Since each of the gate regions 70 is of a heavily doped polysilicon material, the tabularly shaped members 72 and 72a can also be extensions of the polysilicon. Since the tabularly shaped members 74a and 60a are adjacent to one another, and they are of N+ diffusion regions and P+ diffusion regions, respectively, if they are positioned close to one another, latchup can occur. Thus, there is a need to space them further apart. As a consequence, the tabularly shaped members 74a and 60a are shorter in length than their respective counterparts 74 and 60, respectively, which are connected to the respective drain-source regions.

Method Of Customizing The Semiconductor Device

To customize the semiconductor integrated device 40, one begins with a netlist. A netlist is a list of transistors and their interconnections. The netlist can be formed from a circuit diagram of an electronic circuit of the logic unit, in schematic form, with a plurality of schematic transistors. Alternatively, the netlist can be generated based upon the interconnection of a physical device. For example, if a prototype of the logic unit were constructed from discrete devices, and it is desired to implement the circuit in an integrated device, one can generate the netlist based upon the physical discrete devices.

Figure 3:
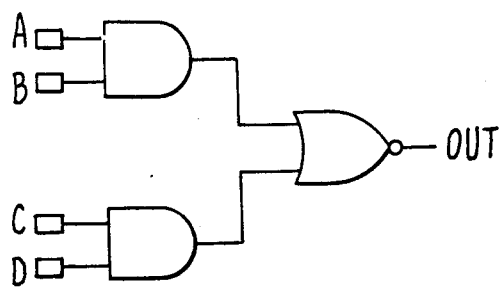
FIG. 3 is a block logic diagram of an electronic circuit, which can be customized in the device of the present invention.

Referring to FIG. 3, there is shown an example of an electronic circuit in block logic form. This is an AND-/OR/INVERT gate. The electronic circuit diagram shown in FIG. 3 is a logic unit or a macro. Other examples of logic units include basic logic gates, such as AND, NAND, OR or NOR gates, or the circuit can be a more complex logic unit such as a flip-flop or a latch or an adder.

Figure 4:
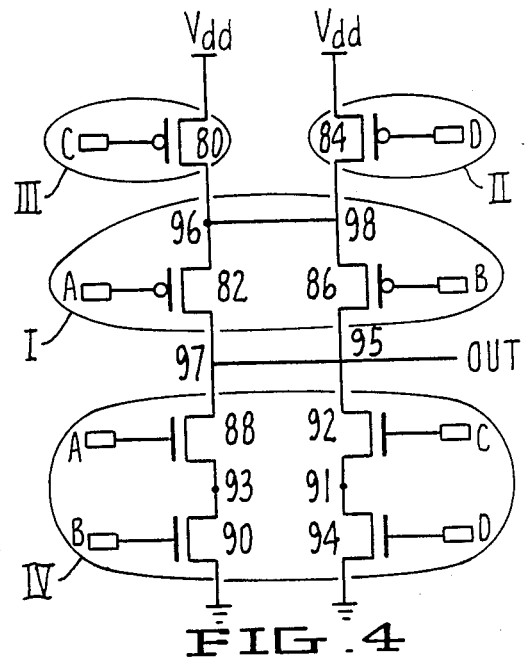
FIG. 4 is an electrical schematic diagram of the electronic circuit shown in FIG. 3, showing the schematic transistors.

Referring to FIG. 4, there is shown the electronic circuit of FIG. 3 in schematic circuit diagram form with schematic transistors.

The method of customizing the semiconductor integrated device 40 in accordance with a netlist entails three general steps: placement, routing and layout generation. Each of these steps has been accomplished by a computer program operating on the Apollo Computer System, written in the MainSail Language. Attached as Exhibits A, B and C are software listings for the placement, routing and layout generation steps, respectively.

The generation of a netlist, as previously stated, can be made from a schematic diagram with a plurality of schematic transistors. For example for the electronic circuit shown in schematic form in FIG. 4, the following netlist is generated:

| Transistor Number | Gate | Drain | Source | Type |
|---|---|---|---|---|
| 80 | C | 96 | $V_{dd}$ | P |
| 82 | A | 96 | 97 | P |
| 84 | D | 96 | $V_{dd}$ | P |
| 86 | B | 96 | 95 | P |
| 88 | A | 97 | 93 | N |
| 90 | B | 93 | Gnd | N |

| Transistor Number | Gate | Drain | Source | Type |
|---|---|---|---|---|
| 92 | C | 91 | 95 | N |
| 94 | D | 91 | Gnd | N |

As previously stated, the label of Drain and Source may be interchanged. The letters on the gate designate the inputs. The numbers on the Drain/Source connection represent the node to which that connection is made. The generation of a netlist is well known in the art.

Placement Step

The placement step begins by reading the netlist. From the netlist all the netlist transistors of the same conductivity are grouped through the use of diffusion line tracing. The diffusion line tracing is described generally in the article by Nogatch and Hedges, as set forth in the Background of the Invention, which is incorporated herein by reference. Unlike the diffusion line tracing technique described in said article, however, which provides for a single diffusion line tracing running through all of the schematic transistors, the grouping of the netlist transistors in each circuit by diffusion line tracing of the present invention forms a plurality of groups. Each group is comprised of netlist transistors whose drain-source line tracing does not reach a voltage source, ground, or a node where the diffusion line branches, i.e. there is a choice in the connecting netlist transistor.

For example, for the netlist for the schematic circuit shown in FIG. 4, one begins with any transistor and places that transistor in a group. Thus, transistor 80 is placed in a group. Then every transistor in the rest of the netlist is analyzed to determine if it "belongs" in that group. The rules for determining belonging have been previously stated. Thus, transistors 88, 90, 92 and 94 do not belong, because they are of a different conductivity type. Since transistor 80 has a diffusion line that can be continued into transistors 82, 86 or 84, those transistors do not belong. Thus, transistor 80 is the only transistor belonging to a group. This is labelled as group III.

Next, the process begins all over again by selecting a transistor from the netlist that remains after the previous selection. Thus, transistor 80 is no longer in the netlist. Transistor 82 is chosen. Transistor 82 is connected to transistor 86 by the node 97. It should be remembered that according to the grouping rules, transistor 82 cannot be grouped with transistor 88 or 92 which is of a different conductivity type. However, at the node 98, there is once again another choice and, thus, the grouping line stops. Thus, this group, referred to as group I, is comprised of two transistors, 82 and 86. Finally, the last group of P type transistors is comprised of transistor 84.

As for the N type transistors, the grouping begins at the source of transistor 90. Transistor 90 is connected to the transistor 88. The only N type transistor connected to transistor 88 is transistor 92. Thus, the diffusion line continues with the transistor 92. Finally, transistor 92 is connected to transistor 94. Thus, the entire four transistors form a single group.

Figure 5A:
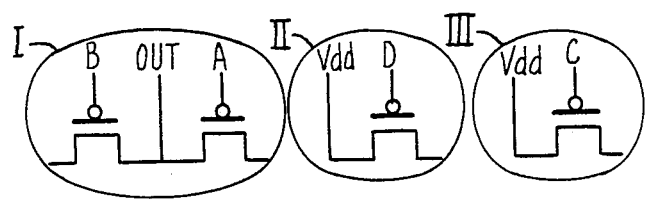
FIGS. 5(a–c) show the grouping of the schematic transistors in the circuit shown in FIG. 4 by diffusion line tracing and assigning each group of schematic transistors to a group of physical transistors and interchanging the groups of the P type conductivity physical transistors to optimize the cost function.
Figure 5B:
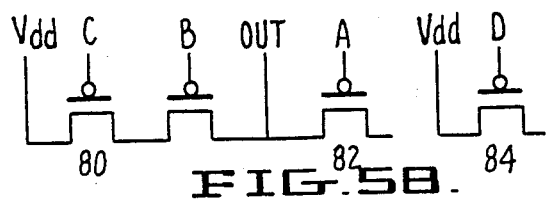
Figure 5C:
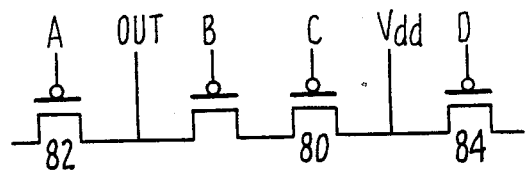

Once the groups of netlist transistors are formed, each group of netlist transistors is assigned to a group of physical transistors; i.e., the transistors that are in the N well 44 or the P well 46. An initial assignment is shown in FIG. 5a. Since there is only one group, group IV, for the entire N-type transistors, that is shown in FIG. 5a. FIGS. 5b and 5c show the steps that are performed after a plurality of groups of netlist transistors are initially assigned to a plurality of groups of physical transistors. These two figures show the result of assignment steps on the P type conductivity transistors in Groups I, II & III.

Initially, groups I, II and III are assigned to the physical transistors, as shown in FIG. 5a. The cost function (which will be discussed hereinafter) is calculated. The assignment of the groups of netlist transistors to physical transistors is changed and the cost function recalculated. In the embodiment set forth in Exhibit A, the computer software generates every possible change of the assignment and calculates the cost function for all those possible changes. Based upon all those possible changes and their associated cost functions, the change resulting in the most reduction in the cost function is chosen. The process is then repeated.

There are three general ways of changing the assignment of the groups of netlist transistors to physical transistors. Each general method also has a number of possibilities within that sub group. The general possibilities are:

1. A group may be mirrored onto itself and its drain and source interchanged.
2. Two groups may change their assignments. Within this possibility, either group may mirror onto itself (as in possibility 1), or both groups may each mirror onto itself.
3. Any group may be moved to either end. Once moved, either group may mirror onto itself.

The initial move to change the groups of transistors is to move group III next to group I. The result is shown in FIG. 5b. FIG. 5c shows the result of the exchange of groups I and III mirrored onto themselves. Thus, transistor 82, which was near one end and was adjacent to transistor 84 became the other end of the group. This result is shown in FIG. 5c. As was described in the article by Noije and Declerck, as described in the Background of the Invention, isolation transistors may be placed between groups if the ends of the groups cannot be connected. In the example shown in FIG. 5c, it was possible to connect transistor 80 to transistor 84 with the connection at that point being tied to a voltage source. Thus, no isolation transistor was used in the placement of the netlist transistors of the circuit diagram shown in FIG. 4 to the physical transistors of the semiconductor integrated device 40.

The cost function, which has been previously described, is calculated in accordance with the following formula:

$$Cost = K_1 * a + K_2 * b + K_3 * c + K_4 * d + K_5 * (e-k_6) + K_7 * (e-k_6)**2$$

where $K_1$, $K_2$, $K_3$, $K_4$, $K_5$, $K_6$ and $K_7$ are tuning constants a—the smaller of the number of isolation transistors used in the P chain or the N chain.
b—the larger of the number of isolation transistors used in the P chain or the N chain.
c—number of direct lineal interconnection between the P chain and the N chain.
d—sum of all the routes, where each route is the distance between the transistors at the extremes of that route.
e—number of tracks needed.

One example of the tuning constants is $K_1=5$; $K_2=0$; $K_3=-3$; $K_4=10$; $K_5=400$; $K_6=6$; $K_7=1$

Routing Step

Once the netlist transistors of an electronic circuit have been assigned to a physical transistor in the device 40, the router is used to decide the manner in which the metal interconnection will be made between the physical transistors to form the intra logic unit connection. The routing step further assigns a grid and general layout value, which is the cost to use each grid point. The routing step preferably places the metal interconnection between transistors to form the logic unit over the tabularly shaped members and extend an electrical connection between those lines and the select tabularly shaped members. However, as it will be appreciated, this means that the metal interconnection lines are all constrained to lie in a dimension which does not exceed the length of each tabularly shaped members. Since the number of metal interconnection lines required for each logic unit would vary, the router program also provides for the routing of the metal interconnect lines over the drain/source regions 54 and 68 and over the gate regions 56 and 70, in the event the number of metal interconnect lines exceed the capacity of these lines to all lie over the tabularly shaped members. Further, the router program provides for the connection of these metal interconnect lines onto the drain/source regions 54 and 68. The router provides for the routing of the interconnect line over the drain/source regions and provide for the interconnection of those lines to the drain/source regions at a cost penalty. The minimum grid point cost penalty is one. The router searches through all the grid points for the path with the minimum penalty.

Figure 6:
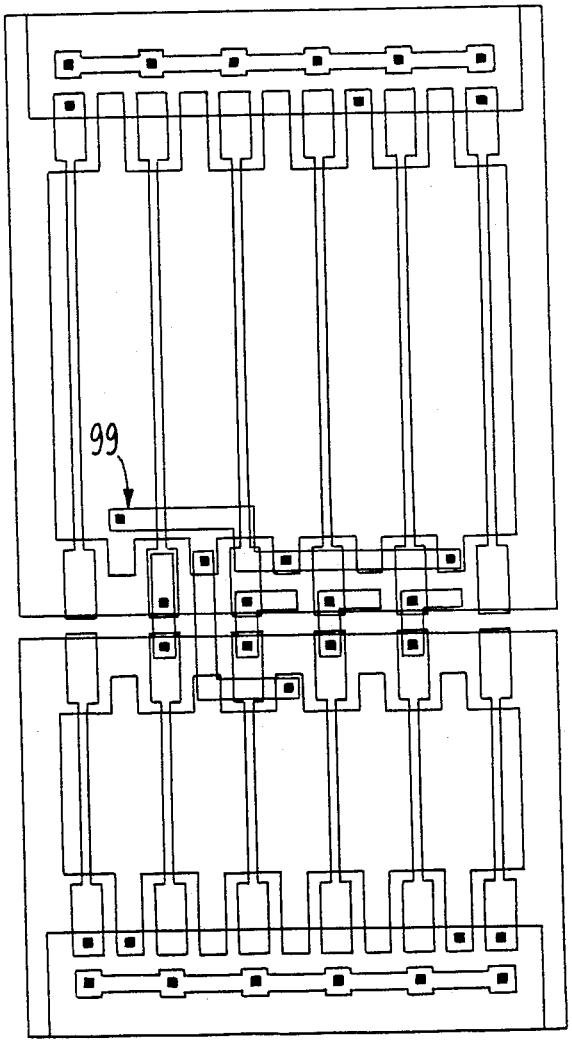
FIG. 6 is a top view of a customized semiconductor integrated device, using the customizable semiconductor integrated device of the present invention to form the electronic circuit shown in FIG. 3.

Referring to FIG. 6, there is shown a top view of the device 40 interconnected to form the electronic circuit as shown in FIG. 4.

As can be seen from FIG. 6, with the exception of one metal interconnect line, the router has chosen to route all the other metal interconnect lines over the tabularly shaped members.

As previously stated, the router has a cost penalty calculation for calculating the metal interconnect lines that are routed over the drain/source regions. Referring to FIG. 12, there is shown a graph of the cost penalty associated with each track in a side view of the customizable device 40 for the routing of the metal interconnect lines over the drain/source regions. From the graph, it can be seen that the cost penalty for routing a line over the P drain/source regions, one track away from the N transistors is only 2. This is a lower cost penalty than routing that line over the drain/source region near the other extreme, which according to the graph has a cost penalty of 5. Further, as can be seen from the graph, the penalty always increases as the routing gets deeper into the drain/source regions.

Once a line has been routed over one of these regions, then a subsequent interconnect line passing over the same region but extending no deeper into the gate or drain-source regions, in the length direction, will incur no additional cost penalty. In other words, for the example shown in FIG. 6, since line 99 lies over a drain/source region and gate region, a subsequent line that is collinear with line 99 will not have any additional cost penalty associated therewith. In short, once a penalty is incurred, subsequent use of that same track will not incur any additional penalty. Thus, cost penalty in this method is dynamically recalculated.

The router also provides for a cost penalty for routing an interconnect line over a gate region at the tabularly shaped members, but not connecting thereto. Since connections to a gate can be made only at the tabularly shaped members (Thus, there are only four connections to each gate), if an interconnect line is routed over a tabularly shaped member connected to a gate region, and that line does not connect to that gate, then only three connections to that gate remain. In that event, the cost penalty for the remaining three gate connections for routing interconnect lines over thereto, but not connecting to that gate, would increase.

Similar to the dynamically changing penalty described heretofore, once a gate connection is made at the tabularly shaped members, all cost penalties for that gate are removed.

In all other aspects, the routing method is based upon well-known prior art technique.

Layout Generation Step

After the routing step is completed, an out put is generated by the router. One example of the output of the router for the electronic circuit of FIG. 4 is shown in FIG. 11. In FIG. 11, "!" means inter logic unit connection and "*" means contact point. The output of the router is translated into a geometric layout form, using well-known prior art techniques. One translation method is to translate the output to CIF (Caltech Intermediate Form).

Figure 7:
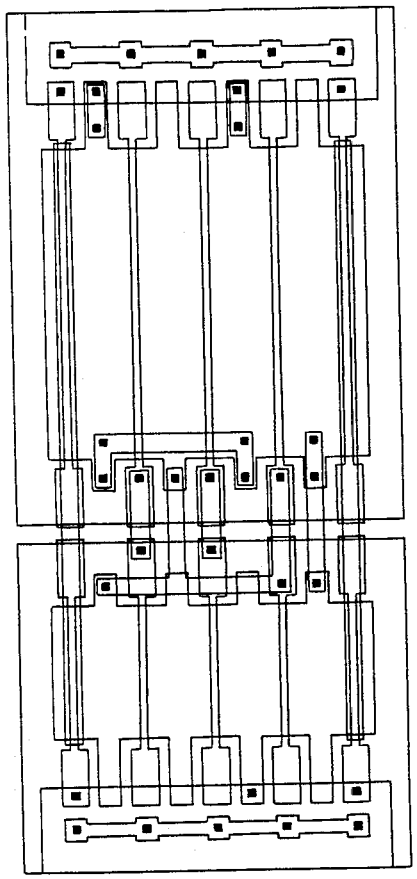
FIG. 7 is a top view of a customized semiconductor integrated device using the customizable semiconductor integrated device of the present invention to form an AND gate.
Figure 8A:
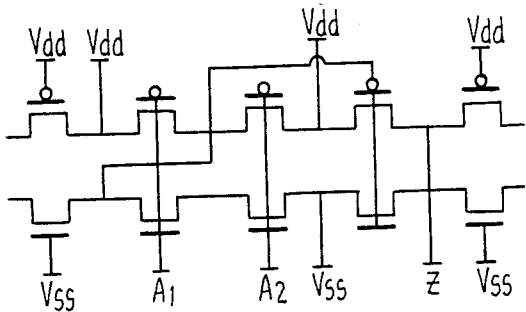
FIG. 8a is a schematic diagram of the customized semiconductor integrated device shown in FIG. 7.
Figure 8B:
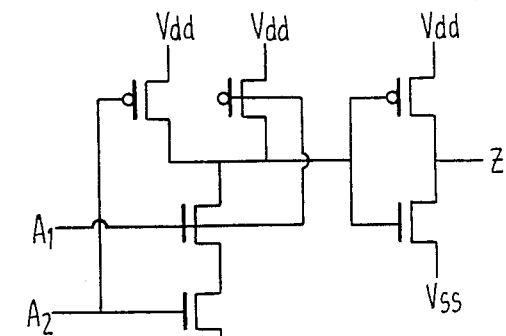
FIG. 8b is the electronic circuit of FIG. 8a, shown in more conventional schematic form.

Referring to FIG. 7, there is shown another device 40 customized in accordance with an electronic circuit. This is an integrated circuit for a AND gate. An electronic schematic diagram of the physical layout shown in FIG. 7 is shown in FIG. 8a. The electronic schematic layout circuit with schematic transistors is shown in more conventional form in FIG. 8b.

Figure 9:
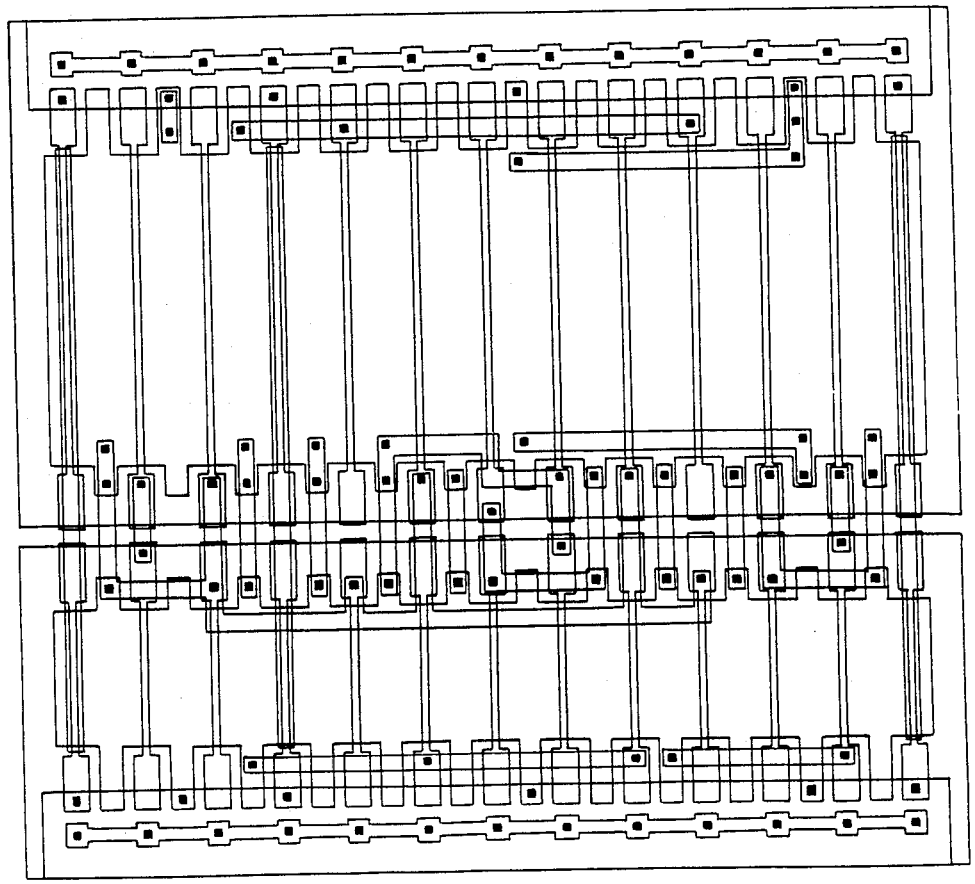
FIG. 9 is a top view of a customized semiconductor integrated device using the customizable semiconductor integrated device of the present invention to form a flip-flop.
Figure 10A:
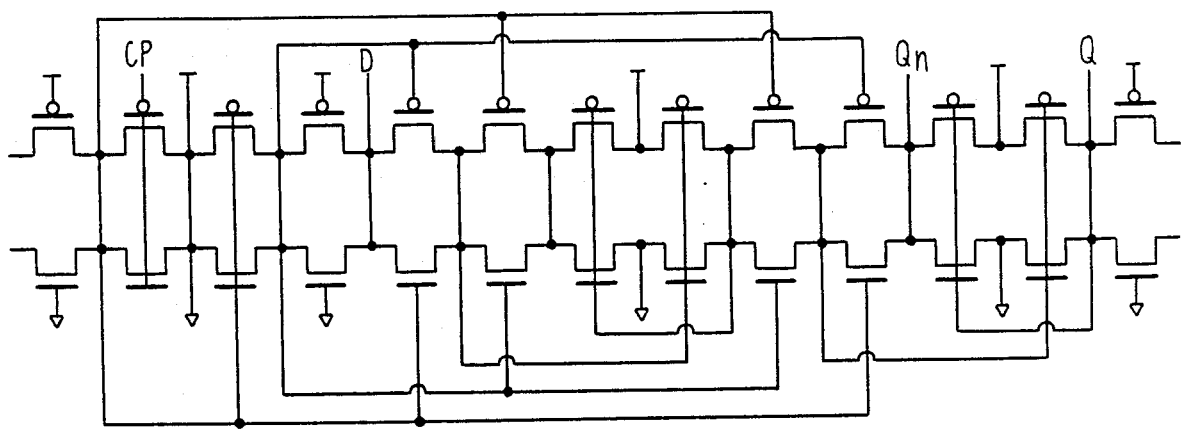
FIG. 10a is a schematic diagram of the customized semiconductor integrated device shown in FIG. 9.
Figure 10B:
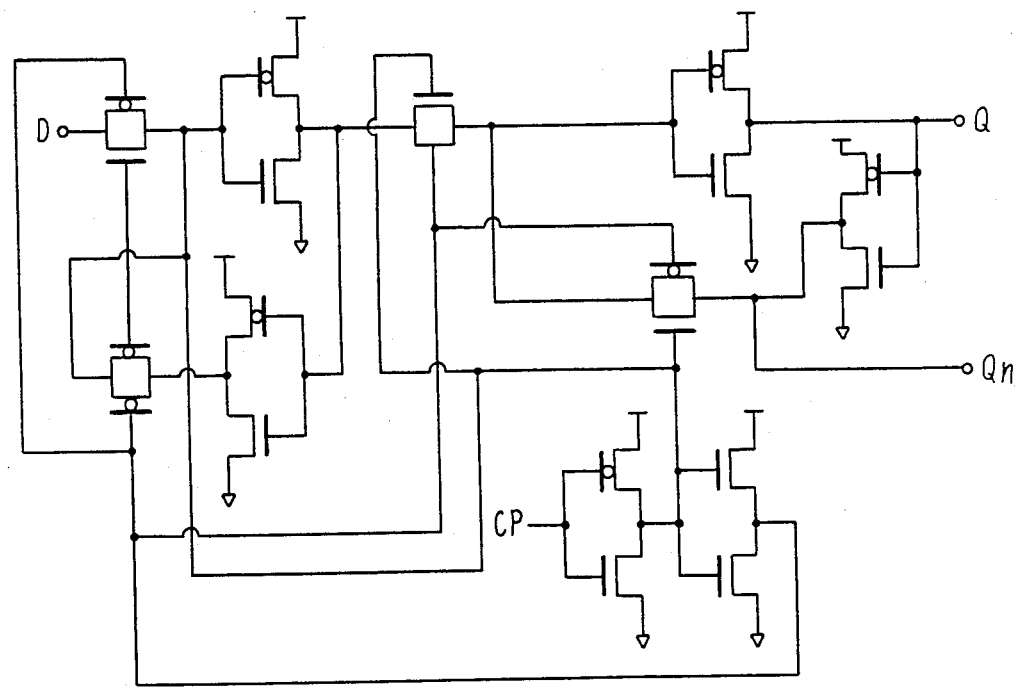
FIG. 10b is the electronic circuit of FIG. 10a shown in more conventional schematic form.

Referring to FIG. 9, there is shown the top view of an integrated semiconductor device 40 customized for a flip-flop. The schematic representation of the physical layout of the device shown in FIG. 9 is shown in FIG. 10a. A more conventional schematic circuit diagram using schematic transistors is shown in FIG. 10b.

It should be apparent that notwithstanding the complexity of the logic unit, such as that shown in FIG. 9, only one track width extends over the regions defined by the gate region 56 or 70 or the drain-source region, 54 or 68, with the rest of the metal interconnect lines lying over the tabularly shaped members. In all other aspects, the area between the tabularly shaped members, i.e., over substantially all of the portions of the drain-source regions or the gate regions, remain unoccupied for the layout of inter logic unit electrical connections. This is the advantage of the device 40 of the present invention. With the device 40 and the method of the present invention, intra logic unit connection or intra unit routing is substantially separated from global or inter logic unit routing. The routing of intra logic unit does not significantly compete for the same space as the global or inter logic unit routing. Since intra logic units are in general smaller units and comprise physical transistors that are closer together than inter logic unit routing, the placement of electrical connection lines for intra logic unit routing can be extended over substantially all of the tabularly shaped members. This has the advantage that, first, the area over the gate region and the drain-source regions remain substantially free for global or inter logic unit routing. Secondly, intra logic unit routing is placed out of the way of inter logic unit routing with regard to track assignment. Thirdly, with intra logic unit routing substantially out of the way of inter logic unit routing, channel routers, which are more efficient that maze routers, can be used for inter logic routing. Finally, by having a topologically complex region for intra logic unit routing, the method of the placement, routing and layout generation of electrical lines for intra logic unit routing can be automated, as shown by the computer programs.

The aforesaid advantages for the device 40 and the method of the present invention can be seen by referring to FIG. 1 which is the customizable semiconductor integrated device 10 of the prior art. As can be seen in FIG. 1, all intra logic unit routing must necessarily cross over the drain-source region 16 and the gate regions 18 for the P channel transistors and over the drain-source regions 20 and gate regions 22 in the P channel transistors. It can be seen in FIG. 1 that intra logic unit routing must compete for global or inter logic unit routing and must squeeze into the area that is otherwise available for global or inter logic unit routing. To accomplish the same result as the device 40 of the present invention, the device 10 must expand its drain-source region 16 lengthwise in order to accommodate both intra logic unit routing and inter logic unit routing. The expansion of a drain-source region 16 has the deleteriously effect of degrading performance, as well as using more silicon area. For these reasons, it should be appreciated that the device 40 and the method of the present invention permits more efficient utilization of areas in a semiconductor substrate than the prior art.

What is claimed is:

1. A method of fabricating an electronic circuit, represented in netlist form and having a plurality of netlist transistors, in a customizable integrated semiconductor device in a substrate, comprising the steps of:
    forming a plurality of chains of continuously electrically connected transistors (hereinafter: "physical transistors"), each chain having physical transistors all of the same conductivity type, in said substrate, each physical transistor has a gate, a source, and a drain;
    electrically connecting the physical transistors to an adjacent physical transistor to form a continuous chain;
    grouping the netlist transistors by diffusion line tracing, forming a plurality of groups;
    assigning each group of netlist transistors to a group of physical transistors;
    calculating the cost function associated with each group of physical transistors;
    optimizing the total cost function by changing the assignment of one or more groups of said netlist transistors to said physical transistors and recalculating the cost function thereafter; and
    routing the electrical interconnection from one group of physical transistors to another group of physical transistors to form the physical layout of said circuit.

2. The method of claim 1, wherein said grouping step further comprises
    connecting the diffusion line of a netlist transistor of a first conductivity type with the diffusion lines of the netlist transistors of the same conductivity type until said line reaches ground, voltage source or a plurality of diffusion lines of the netlist transistors of the same conductivity type.

3. The method of claim 2, wherein said chains comprise a chain of P type physical transistors and a chain of N type physical transistors, each chain in a well, substantially parallel to and spaced apart from one another;
    each chain comprising a plurality of substantially rectangularly shaped diffusion regions, positioned in said substrate in an array, spaced apart from one another; a plurality of substantially rectangularly shaped gate regions, spaced apart from one another with each gate region lying substantially between a pair of adjacent drain-source regions;
    a plurality of tabularly shaped members, each spaced apart from one another, electrically connected to said gate regions and said drain-source regions; and
    each member which is connected to a gate region is positioned between adjacent members connected to drain-source regions, said tabularly shaped members providing for the interconnection to said physical transistors.

4. The method of claim 3 wherein said routing step further comprising placing electrical interconnect lines over said tabularly shaped members and extending an electrical connection between said lines and selected members.

5. The method of claim 4 wherein said routing step further comprising
    providing a cost penalty for placing electrical interconnect lines over said gate and drain-source regions, in the event no interconnect lines over said regions have been provided and in the event no gate connection has been provided;
    placing electrical interconnect lines over said gate and drain-source regions without any additional cost penalty to the extent an interconnect line has already been placed over said regions; and
    placing interconnect lines over gate connection regions without any additional cost penalty in the event that gate has been connected.

6. The method of claim 5 wherein said cost function associated with each group is calculated in accordance with $$Cost = K_1 * a + K_2 * b + K_3 * c + K_4 * d + K_5 *(e-k_6) + K_7 *(e-k_6)**2$$

where $K_1$, $K_2$, $K_3$, $K_4$, $K_5$, $K_6$ and $K_7$ are tuning constants
    a—the smaller of the number of isolation transistors used in the P chain or the N chain.
    b—the larger of the number of isolation transistors used in the P chain or the N chain.
    c—number of direct lineal interconnection between the P chain and the N chain.
    d—sum of all the routes, where each route is the distance between the transistors at the extremes of that route.
    e—number of tracks needed.

7. The method of claim 1 further comprising fabricating a plurality of electronic circuits with each circuit represented in netlist form and having a plurality of netlist transistors.

8. The method of claim 7 further comprising the steps of:
    separating each physical layout of a circuit from one another where needed by an isolation transistor; and
    connecting the gate of each isolation transistor to a voltage source, thereby isolating physical layouts of said circuits.

* * * * *